(12) United States Patent
Yamakaji

(10) Patent No.: US 6,811,260 B2
(45) Date of Patent: Nov. 2, 2004

(54) EYEGLASS LENS DESIGNING METHOD AND EYEGLASS LENS

(75) Inventor: Tetsuma Yamakaji, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 10/169,561

(22) PCT Filed: Apr. 26, 2002

(86) PCT No.: PCT/JP02/04244

§ 371 (c)(1),
(2), (4) Date: Jul. 26, 2002

(87) PCT Pub. No.: WO02/088828

PCT Pub. Date: Nov. 7, 2002

(65) Prior Publication Data

US 2003/0107702 A1 Jun. 12, 2003

(30) Foreign Application Priority Data

Apr. 26, 2001  (JP) ........................................ 2001-130059

(51) Int. Cl.⁷ ................................................ G02C 7/02
(52) U.S. Cl. ...................................... 351/177; 351/159
(58) Field of Search ................................ 351/159, 176, 351/177

(56) References Cited

U.S. PATENT DOCUMENTS

| | | | |
|---|---|---|---|
| 4,504,128 A | | 3/1985 | Guilino et al. |
| 6,012,813 A | * | 1/2000 | Qi ................................ 351/176 |
| 6,382,789 B1 | * | 5/2002 | Baudart et al. ............. 351/177 |
| 2003/0107702 A1 | * | 6/2003 | Yamakaji .................... 351/159 |

FOREIGN PATENT DOCUMENTS

| | | |
|---|---|---|
| EP | 0 886 166 A2 | 12/1998 |
| EP | 0 990 939 A1 | 4/2000 |
| JP | 42-9416 | 5/1942 |
| JP | A 55-59425 | 5/1980 |
| JP | A 57-10112 | 1/1982 |
| JP | A 62-30216 | 2/1987 |
| JP | A 2-38930 | 2/1990 |
| JP | B2 2-38930 | 9/1990 |
| WO | WO 93/07525 | 4/1993 |

OTHER PUBLICATIONS

Optometric Monthly, Nov. 1981, "Uncorrected Visual Acuity and Refractive Error", Robert N. Kleinstein, pp. 31–32.

Optics, vol. 19, No. 10, "On Angle Magnification Again", Kazuo Miyake, pp. 73–77.

* cited by examiner

Primary Examiner—Scott J. Sugarman
(74) Attorney, Agent, or Firm—Oliff & Berridge PLC

(57) ABSTRACT

It is made possible to easily obtain a spectacle lens with higher performance in a spectacle lens designing method in which an eyeball motion (Listing's Law) is taken into consideration. A spectacle lens designing method in which an eye motion (Listing's Law) is taken into consideration, and which uses, as an evaluation function regarding visual acuity constituting a merit function which is used in optimization calculation, a visual acuity evaluation function (logMAR) derived in an ordinary manner from a visual acuity measured value V which is actually measured. Note that the visual acuity evaluation function (logMAR) is represented by the following equation (1), letting a curvature of field be an ordinary aberration of a spectacle lens, and a residual astigmatism be an astigmatism extendedly defined from the spectacle lens designing in which the Listing's Law is taken into consideration.

the visual acuity evaluation function $(logMAR) = \log_{10}(1/V(\text{curvature of field, residual astigmatism}))$

14 Claims, 12 Drawing Sheets

FIG.3

TABLE 1

| | |
|---|---|
| SPHERICAL DIOPTER (D) | −7 |
| CYLINDRICAL DIOPTER (D) | −2 |
| REFRACTIVE INDEX | 1.7 |
| CENTER THICKNESS (mm) | 1 |
| LENS DIAMETER (mm) | 75 |
| COEFFICIENT OF FRONT SURFACE | |
| $c$ (1/mm) | 0.001072487 |
| $k$ | 0 |
| $a(4)$ | −1.97074E−08 |
| $a(5)$ | 8.85819E−14 |
| $a(6)$ | 1.95158E−13 |
| $a(7)$ | 1.38536E−15 |
| COEFFICIENT OF REAR SURFACE | |
| $c(0)$ (1/mm) | 0.011087268 |
| $c(90)$ (1/mm) | 0.013948498 |
| $k(0)$ | 0 |
| $k(90)$ | 0 |
| $a(4,0)$ | −3.85844E−07 |
| $a(5,0)$ | 1.43865E−11 |
| $a(6,0)$ | 1.21339E−11 |
| $a(7,0)$ | 7.21652E−14 |
| $a(4,45)$ | −3.73841E−07 |
| $a(5,45)$ | 7.63300E−12 |
| $a(6,45)$ | 8.96739E−12 |
| $a(7,45)$ | 6.20817E−14 |
| $a(4,90)$ | −3.58938E−07 |
| $a(5,90)$ | 5.05381E−15 |
| $a(6,90)$ | 2.66708E−14 |
| $a(7,90)$ | −1.34963E−17 |

FIG.4

TABLE 2

| | |
|---|---|
| SPHERICAL DIOPTER (D) | −7 |
| CYLINDRICAL DIOPTER (D) | −2 |
| REFRACTIVE INDEX | 1.7 |
| CENTER THICKNESS (mm) | 1 |
| LENS DIAMETER (mm) | 75 |
| COEFFICIENT OF FRONT SURFACE | |
| c (1/mm) | 0.001072487 |
| k | 0 |
| a(4) | −1.97074E−08 |
| a(5) | 8.85819E−14 |
| a(6) | 1.95158E−13 |
| a(7) | 1.38536E−15 |
| COEFFICIENT OF REAR SURFACE | |
| c(0) (1/mm) | 0.011087267 |
| c(90) (1/mm) | 0.013948497 |
| k(0) | 0 |
| k(90) | 0 |
| a(4,0) | −2.81268E−07 |
| a(5,0) | −1.18827E−08 |
| a(6,0) | 4.45672E−10 |
| a(7,0) | −4.25475E−12 |
| a(4,45) | −5.57166E−07 |
| a(5,45) | 1.97681E−08 |
| a(6,45) | −7.08420E−10 |
| a(7,45) | 1.01548E−11 |
| a(4,90) | −5.57166E−07 |
| a(5,90) | 1.97681E−08 |
| a(6,90) | −7.08420E−10 |
| a(7,90) | 1.01548E−11 |

FIG.7

TABLE 3

| | |
|---|---|
| SPHERICAL DIOPTER (D) | −7 |
| CYLINDRICAL DIOPTER (D) | −2 |
| REFRACTIVE INDEX | 1.7 |
| CENTER THICKNESS (mm) | 1 |
| LENS DIAMETER (mm) | 75 |
| COEFFICIENT OF FRONT SURFACE | |
| c (1/mm) | 0.001072487 |
| k | 0 |
| a(4) | −1.97074E−08 |
| a(5) | 8.85819E−14 |
| a(6) | 1.95158E−13 |
| a(7) | 1.38536E−15 |
| COEFFICIENT OF REAR SURFACE | |
| c(0) (1/mm) | 0.011087267 |
| c(90) (1/mm) | 0.013948497 |
| k(0) | 0 |
| k(90) | 0 |
| a(4,0) | −4.52371E−07 |
| a(5,0) | 2.01806E−11 |
| a(6,0) | 1.59487E−11 |
| a(7,0) | 9.06874E−14 |
| a(4,45) | −4.97139E−07 |
| a(5,45) | 2.52748E−11 |
| a(6,45) | 2.09235E−11 |
| a(7,45) | 1.22387E−13 |
| a(4,90) | −5.60973E−07 |
| a(5,90) | 1.25807E−11 |
| a(6,90) | 8.49791E−12 |
| a(7,90) | 4.25676E−14 |

FIG.8

| | | | | | | | | | | | | | | | |
|---|---|---|---|---|---|---|---|---|---|---|---|---|---|---|---|
| -59.6931 | -60.1623 | -61.6093 | -64.1705 | -68.1405 | -74.1677 | 0 | 0 | 0 | 0 | 0 | 0 | 0 | 0 | 0 | 0 |
| -43.5179 | -43.8229 | -44.753 | -46.3581 | -48.7333 | -52.0415 | -56.5623 | -62.8168 | -71.989 | 0 | 0 | 0 | 0 | 0 | 0 | 0 |
| -33.065 | -33.2978 | -34.005 | -35.2159 | -36.9847 | -39.3991 | -42.5962 | -46.7939 | -52.3581 | -59.9816 | -71.3421 | 0 | 0 | 0 | 0 | 0 |
| -25.5597 | -25.7503 | -26.3278 | -27.3123 | -28.7408 | -30.6722 | -33.1953 | -36.444 | -40.6232 | -46.065 | -53.3625 | -63.7937 | 0 | 0 | 0 | 0 |
| -19.8923 | -20.0551 | -20.5478 | -21.3846 | -22.5927 | -24.2154 | -26.3179 | -28.9958 | -32.3904 | -36.7157 | -42.3139 | -49.7881 | -60.4086 | 0 | 0 | 0 |
| -15.4833 | -15.6272 | -16.0616 | -16.7965 | -17.8516 | -19.2601 | -21.0729 | -23.3645 | -26.243 | -29.8656 | -34.4741 | -40.4501 | -48.4815 | -60.0583 | 0 | 0 |
| -11.9876 | -12.1189 | -12.5138 | -13.1775 | -14.1231 | -15.3758 | -16.9769 | -18.9881 | -21.4983 | -24.6341 | -28.5803 | -33.6192 | -40.2141 | -49.2261 | -62.6857 | 0 |
| -9.18283 | -9.30718 | -9.67833 | -10.2946 | -11.1613 | -12.2967 | -13.7357 | -15.5327 | -17.7651 | -20.5404 | -24.0114 | -28.4025 | -34.064 | -41.5954 | -52.1936 | 0 |
| -6.91805 | -7.0418 | -7.40565 | -7.99561 | -8.80594 | -9.84893 | -11.1571 | -12.7822 | -14.7955 | -17.2932 | -20.4068 | -24.3243 | -29.3295 | -35.8839 | -44.8299 | -58.0724 |
| -5.08703 | -5.21989 | -5.53802 | -6.18228 | -6.95091 | -7.91379 | -9.10742 | -10.5865 | -12.4207 | -14.6983 | -17.536 | -21.0965 | -25.62 | -31.485 | -39.3455 | -50.526 |
| -3.61325 | -3.73374 | -4.19942 | -4.7966 | -5.52481 | -6.40401 | -7.48603 | -8.83414 | -10.5181 | -12.6194 | -15.2423 | -18.5306 | -22.6937 | -28.0556 | -35.1572 | -45.0236 |
| -2.44084 | -2.67068 | -3.19568 | -3.80876 | -4.47112 | -5.24342 | -6.20696 | -7.43504 | -8.99447 | -10.9576 | -13.4164 | -16.499 | -20.3923 | -25.383 | -31.9389 | -40.91 |
| -1.52852 | -1.93041 | -2.6085 | -3.18603 | -3.71659 | -4.34548 | -5.1868 | -6.31326 | -7.77884 | -9.64193 | -11.982 | -14.9145 | -18.6099 | -23.329 | -29.4912 | -37.8372 |
| -0.84545 | -1.64687 | -2.42504 | -2.81807 | -3.13021 | -3.60073 | -4.34585 | -5.4107 | -6.82371 | -8.62709 | -10.8902 | -13.7199 | -17.2763 | -21.8028 | -27.6872 | -35.6001 |
| -0.37331 | -1.88047 | -2.42394 | -2.43121 | -2.51626 | -2.9032 | -3.63555 | -4.70437 | -6.11199 | -7.89326 | -10.115 | -12.8814 | -16.3474 | -20.7463 | -26.446 | -34.0739 |
| -0.09486 | -2.31991 | -1.92713 | -1.62837 | -1.74356 | -2.25845 | -3.09731 | -4.22669 | -5.6602 | -7.44313 | -9.64838 | -12.3821 | -15.7979 | -20.1242 | -25.7183 | -33.1838 |
| 0 | -0.07642 | -0.29895 | -0.6769 | -1.22132 | -1.94872 | -2.88209 | -4.05289 | -5.50335 | -7.2905 | -9.49207 | -12.2159 | -15.6157 | -19.9185 | -25.4781 | -32.8909 |
| | | | | | | | | | | | | | | | -43.3022 |

FIG. 9

| | | | | | | | | | | | | | | | | |
|---|---|---|---|---|---|---|---|---|---|---|---|---|---|---|---|---|
| -63.4055 | -63.9284 | -65.5505 | -68.4577 | -73.0769 | -80.5 | 0 | 0 | 0 | 0 | 0 | 0 | 0 | 0 | 0 | 0 | 0 |
| -45.6386 | -45.9604 | -46.9441 | -48.6477 | -51.1813 | -54.7357 | -59.6498 | -66.593 | -77.3071 | 0 | 0 | 0 | 0 | 0 | 0 | 0 | 0 |
| -34.4953 | -34.7363 | -35.4697 | -36.7287 | -38.5737 | -41.1022 | -44.4669 | -48.9139 | -54.8678 | -63.1758 | -76.1614 | 0 | 0 | 0 | 0 | 0 | 0 |
| -26.584 | -26.7785 | -27.3695 | -28.3802 | -29.8517 | -31.8486 | -34.4678 | -37.8549 | -42.2347 | -47.978 | -55.7684 | -67.1859 | 0 | 0 | 0 | 0 | 0 |
| -20.6463 | -20.8103 | -21.3079 | -22.1567 | -23.3881 | -25.0501 | -27.2136 | -29.9812 | -33.5042 | -38.013 | -43.8822 | -51.7889 | -63.2384 | 0 | 0 | 0 | 0 |
| -16.0453 | -16.1875 | -16.619 | -17.3537 | -18.4169 | -19.8469 | -21.6995 | -24.0542 | -27.025 | -30.7786 | -35.5695 | -41.8136 | -50.2724 | -62.6846 | 0 | 0 | 0 |
| -12.4077 | -12.5339 | -12.9163 | -13.5667 | -14.505 | -15.7661 | -17.3932 | -19.4524 | -22.0355 | -25.2737 | -29.3603 | -34.5936 | -41.4727 | -50.9488 | -65.3963 | 0 | 0 |
| -9.49543 | -9.60938 | -9.95448 | -10.5407 | -11.3858 | -12.5171 | -13.9742 | -15.8125 | -18.1095 | -20.9742 | -24.5631 | -29.1104 | -34.9868 | -42.8379 | -53.9915 | 0 | 0 |
| -7.14785 | -7.25241 | -7.56877 | -8.10532 | -8.87732 | -9.9087 | -11.2343 | -12.9029 | -14.9822 | -17.565 | -20.7872 | -24.84 | -30.0216 | -36.8223 | -46.1539 | -60.1604 | 0 |
| -5.25256 | -5.34992 | -5.6441 | -6.14188 | -6.8554 | -7.80904 | -9.03133 | -10.5674 | -12.4778 | -14.846 | -17.7884 | -21.4725 | -26.1491 | -32.2171 | -40.3755 | -52.0737 | 0 |
| -3.72881 | -3.82083 | -4.09812 | -4.56555 | -5.23438 | -6.1243 | -7.2647 | -8.69642 | -10.475 | -12.6761 | -15.4045 | -18.8091 | -23.1091 | -28.6456 | -35.9922 | -46.2544 | 0 |
| -2.51778 | -2.60818 | -2.87099 | -3.31454 | -3.94657 | -4.78618 | -5.86165 | -7.21153 | -8.88754 | -10.9596 | -13.5238 | -16.7158 | -20.7329 | -25.877 | -32.6428 | -41.9387 | -55.8314 |
| -1.57612 | -1.66279 | -1.91908 | -2.34318 | -2.94487 | -3.74424 | -4.76911 | -6.05615 | -7.65398 | -9.62811 | -12.0683 | -15.1005 | -18.9056 | -23.7617 | -30.1084 | -38.7339 | -51.3144 |
| -0.87254 | -0.96011 | -1.21025 | -1.61656 | -2.19304 | -2.96153 | -3.94903 | -5.19015 | -6.73094 | -8.6336 | -10.9833 | -13.8992 | -17.5526 | -22.2002 | -28.2499 | -36.4121 | -48.1376 |
| -0.3847 | -0.47775 | -0.71888 | -1.10633 | -1.66463 | -2.41291 | -3.37597 | -4.58665 | -6.08911 | -7.94337 | -10.2316 | -13.0685 | -16.5183 | -21.1259 | -26.9771 | -34.8348 | -46.0174 |
| -0.09768 | -0.19959 | -0.41743 | -0.79949 | -1.34578 | -2.08512 | -3.03571 | -4.22962 | -5.71031 | -7.5367 | -9.78936 | -12.5804 | -16.0702 | -20.4968 | -26.2339 | -33.9181 | -44.798 |
| 0 | -0.07739 | -0.30289 | -0.68594 | -1.23787 | -1.97558 | -2.92265 | -4.11133 | -5.58501 | -7.40232 | -9.64333 | -12.4194 | -15.8895 | -20.2896 | -25.9894 | -33.6172 | -44.3996 |

EYEGLASS LENS DESIGNING METHOD AND EYEGLASS LENS

TECHNICAL FIELD

The present invention relates to a spectacle lens designing method and a spectacle lens designed by the same.

BACKGROUND ART

The Listing's Law in an eyeball motion means that, when an eyeball looks far forward (first eye position), a rotation axis of the eyeball motion exists in a surface including the center of rotation of the eyeball and being perpendicular to this eye position (Listing's surface). In this case, when the eyeball rotates from the first eye position along spectacle principal meridians (representing two vertical and horizontal lines orthogonal to each other on a Gaussian curved surface and representing the same below) according to the Listing's Law at the time one wears astigmatic spectacles, the spectacle principal meridians and axes of a coordinate system rotating according to the Listing's Law become parallel to each other and an angle between them becomes 0.

However, when the eyeball motion changes in a direction different from the spectacle meridians, the angle made by the spectacle meridians and the coordinate axes rotating according to the Listing's Law do not become 0 to cause an angle deviation.

By taking this angle deviation of the coordinate system into consideration, an accurate astigmatism and curvature of field (also called a power error) can be calculated.

A spectacle lens designing method in which this eyeball motion (Listing's Law) is taken into consideration is disclosed in Japanese Patent Laid-open No. Sho 57-10112 (hereinafter, referred to as Prior art 1)(refer to FIG. 5 in Prior art 1).

Meanwhile, optimization of evaluation functions for several kinds of aberrations, a lens shape, and so on by optimization calculation in an aberration correction process in designing a lens is known as is disclosed, for example, in Japanese Patent Publication No. Hei 2-38930.

To explain the outline of this optimization calculation, taking designing of a single vision aspherical lens for example, though it is a known technique in spectacle lens designing, data on a lens material and prescription specifications are given as basic design specifications, items such as a center thickness are further included as additional specifications in a case of a positive lens, and a combination of refractive surface shapes of a front surface and a rear surface which satisfies them and has as small an optical aberration as possible is obtained by calculation. The refractive surface is expressed as a surface which is mathematized by a function and the function consists of a plurality of parameters defining a spectacle lens. The parameters include a refractive index of the material, a lens diameter, radii of curvature of the front surface and the rear surface, the center thickness, an aspherical conic coefficient, a high degree aspherical coefficient, and so on. They are classified into fixed factors and variable factors according to the object of the lens designing, and the variable factors are dealt as variable parameters.

Then, using a ray tracing method and a wave front tracing method, a plurality of evaluation points whose distances from an optical axis on the refractive surface are different are set on the lens surface, the optical aberration on each of the evaluation points is expressed as an evaluation function (merit function), and calculation to obtain the minimum evaluation function is done using an optimization calculation method such as a damped least square method. At this time, simulations are repeated while operating the variable parameters of the refractive surface, and when a target value is obtained, the final shape of the refractive surface is determined.

As the parameters constituting the evaluation function (merit function) in the optimization calculation, an astigmatism and a curvature of field are generally known, and in a case, for example, when the front surface and the rear surface are both spherically designed in a designing method in a prior art, assuming that the aberrations showing, in a unit of diopter, two focal positions Ft, Fs obtained by the ray tracing method based on a focus D obtained by a paraxial ray tracing are t (tangential error) and s (sagittal error) as shown in FIG. 11, a lens in which the astigmatism=(t−s) is minimum is called a Tscheming Form and a lens in which the curvature of field=(t+s)/2 is minimum is called a Percival Form. In Japanese Patent Publication No. Sho 42-9416, an evaluation function in which t and s are complicatedly combined and which is expressed as a horizontal aberration is disclosed.

A distortion aberration is known to be also an important evaluation function in the aforesaid design optimization calculation, and designing in which it is taken into consideration is proposed, for example, in Japanese Patent Laid-open No. Sho 55-59425 (hereinafter, referred to as Prior art 2) and APPLIED OPTICS, Vol. 21, No. 162982-2991: written by Milton Katz (hereinafter, referred to as Prior art 3).

As one of free curved surfaces among lens refractive surface shapes, an atoric surface is known besides a spherical surface and an astigmatic surface. The use of a spline function as an equation used to express the atoric surface is disclosed in Japanese Patent Laid-open No. Sho 62-30216 (Prior art 4) and an equation using orthogonal functions of xy is disclosed in International Publication No. WO 93/07525 (hereinafter, referred to as Prior art 5) is disclosed.

In recent years, however, it has been found out that visual acuity is closely related to processing in the brain and it has been known that the visual acuity is mainly constituted by an image on a retina and processing of the image in the retina and the brain.

Meanwhile, in the designing of spectacle lenses in the prior art, such an idea has been dominant that performance of a spectacle lens is improved as optical performance of the lens becomes higher.

For example, in the optimization calculation method described above, the evaluation function in the prior art is based on an evaluation only by optical calculation, such as evaluation of the size of an image and t (tangential error) and s (sagittal error) of the aberration and so on which are calculated at a far point sphere (FPS) in FIG. 11 by the ray tracing method, and furthermore, an image plane or a retina surface are also dealt as a film surface of a camera without considering a physiological function of an eye such as the eyeball motion.

Furthermore, since the distortion aberration is dealt as an optical amount of a camera as described above also in the above-mentioned Prior art 3, the evaluation function used in it is different from an evaluation function based on a visual angle magnification M which is used in spectacles (for example, *KOHGAKU* (OPTICS), Vol. 19, No. 10 "*Futatabi Kakubairitsu nitsuite* (On Angle Magnification Again)" Kazuo Miyake), and furthermore, an astigmatic lens and the designing in which the eyeball motion is taken into consideration are not disclosed either. Furthermore, the above-mentioned Prior art 2 does not disclose any concrete technical content thereof and its actual state is not clear.

Meanwhile, in lens designing, the use of the spline function for the atoric surface having a higher degree of freedom of expression, which is disclosed in the above-mentioned Prior art 4, enables the expression of free surface shapes, but it has a disadvantage that it basically lacks precision in surface expression. Moreover, in the above-mentioned Prior art 5, the properties of the eyeball motion using the Listing's Law are not utilized to result in an insufficient optical surface.

Prior art 1 discloses a designing method in which the eyeball motion is taken into consideration using the Listing's Law. However, here, the explanation of the above-described technical idea is focused on, and in the concrete lens designing, performance evaluation is made based only on an astigmatism derived from optical calculation, and an evaluation function in the optimization calculation is insufficient.

Moreover, no concrete disclosure on the expression of a lens surface is given.

Furthermore, designing in this Prior art 1 is essentially the same as the one in the prior art based on the idea that performance of a spectacle lens is improved as optical performance becomes higher and it gives no consideration to the correlation with visual acuity.

Thus, it is clear that performance evaluation of a spectacle lens based only on indexes such as an optical amount on the retina and the aberrations is inaccurate as a simulation on a living human body since no consideration is given to the viewpoints of the processing in the retina and the brain and of the eyeball motion as described above.

An object of the present invention, which is made to solve these problems, is to provide a spectacle lens with high performance which improves visual acuity and to provide a designing method of the same.

DISCLOSURE OF THE INVENTION

In order to solve the above-described problems, a first invention is a spectacle lens designing method in which an eyeball motion (Listing's Law) is taken into consideration, and which is characterized in that a merit function used in optimization calculation processing of lens designing includes a visual acuity evaluation function (logMAR) derived from a visual acuity measured value V, where the visual acuity evaluation function (logMAR) is expressed by the following equation (1), letting a curvature of field be an aberration of a spectacle lens and a residual astigmatism be an astigmatism defined from spectacle lens designing in which the Listing's Law is taken into consideration:

the visual acuity evaluation function (log$MAR$)=log$_{10}$ (1/$V$ (curvature of field, residual astigmatism)) (1)

A second invention is a spectacle lens designing method which is characterized in that, in the spectacle lens designing method of the first invention, letting the visual acuity measured value V be V=$2^{-xK}$ (where K={(residual S diopter+residual C diopter/2)$^2$+ (residual C diopter/2)$^2$}$^{1/2}$ and X is a coefficient between 0.5 and 2 according to actual measurement data), the visual acuity evaluation function (logMAR) is expressed by the following equation (2) which is an approximate equation:

the visual acuity evaluation function (log$MAR$)=$X$×log$_{10}$2×{curvature of field$^2$+(residual astigmatism/2)$^2$}$^{1/2}$ (2)

A third invention is a spectacle lens designing method which is characterized in that, in the spectacle lens designing method of the first invention, the merit function includes an evaluation function on a distortion aberration (residual distortion aberration DIST) and the evaluation function is expressed by the following equation (3):

residual distortion aberration $DIST$=Sign×100×(absolute value of residual visual angle magnification/absolute value of central visual angle magnification $M_0$) (3)

where:

the residual visual angle magnification is the distortion aberration defined from the spectacle lens designing in which the Listing's Law is taken into consideration; and Sign is a positive/negative sign.

A fourth invention is a spectacle lens designing method which is characterized in that, in the lens designing method according to any one of the first invention to the third invention, the merit function is used in optimization calculation of lens designing of a bi-aspherical lens in which a front surface is an axially symmetrical aspherical surface and a rear surface is an aspherical surface expressed by the following equation (4):

$$Z2 = c(\theta) \cdot r^2 \bigg/ \left(1 + \sqrt{1 - (1 + k(\theta)) \cdot c(\theta)^2 \cdot r^2}\right) + \sum_n a(n, \theta) \cdot r^n \quad (4)$$

where:

$c(\theta)$, $k(\theta)$ are functions for an azimuth $\theta$;

$a(n, \theta)$ is a function for an n degree of a distance r and the azimuth $\theta$;

as for a definition domain of the azimuth $\theta$, 0 degree to 90 degrees represents 0 degree to 360 degrees due to plane symmetry of an astigmatic lens;

$c(\theta)$ is a curvature of a lens center and is expressed by the following equation (5) based on the Euler's theorem, letting a curvature of a spectacle principal meridian in the Gaussian curve theorem be $c(0)$ at 0 degree and $c(90)$ at 90 degrees. In this case, 0 degree is a spherical diopter axis and 90 degrees is a cylinder diopter axis;

$c(\theta)=c(0)\cdot\cos^2\theta+c(90)\cdot\sin^2\theta$ (5)

$k(\theta)$, which is similar to $c(\theta)$ above, represents an equation in which the sign c is replaced by the sign k in the above equation (5); and $a(n, \theta)$ satisfies requirements of plane continuity and plane symmetry, is a surface further satisfying a requirement of a surface which is capable of controlling an aberration due to an angle deviation which occurs due to the Listing's Law, and further satisfies the following conditions ① to ④:

①: having a functional relation of the azimuth $\theta$ from 0 degree to 90 degrees;

②: a linear differential coefficient of the azimuth $\theta$ is 0 from 0 degree to 90 degrees;

③: a high degree differential coefficient is continuous; and

④: having a control parameter group Ps(n) which is capable of controlling a value of $a(n, \theta)$ at an angle $\theta$ of a function between the azimuths 0 degree and 90 degrees (where 1 to 3 are preferable for s, and n signifies a degree in the above equation (4)).

A fifth invention is a spectacle lens designing method which is characterized in that, in the spectacle lens designing method according to the fourth invention, $a(n, \theta)$ in the above equation (4) is expressed by the following equation (6) which is a quartic polynominal of the azimuth $\theta$, letting a be $a(n, 0)$, $a(n, 45)$, and $a(n, 90)$ when the azimuth $\theta$ is 0 degree, 45 degrees, and 90 degrees respectively:

$$a(n, \theta) = a(n, 0) + (-11 \cdot a(n, 0) + 16 \cdot a(n, 45) - 5 \cdot a(n, 90)) \cdot \theta^2/(4 \cdot 90^2) + (9 \cdot a(n, 0) - 16 \cdot a(n, 45) + 7 \cdot a(n, 90)) \cdot \theta^3/(4 \cdot 90^3) + (-2 \cdot a(n, 0) + 4 \cdot a(n, 45) - 2 \cdot a(n, 90)) \cdot \theta^4/(4 \cdot 90^4) \quad (6)$$

where a control parameter is one for the degree n of the distance r from the center and a control parameter $P1(n)$ is $a(n, 45)$.

A sixth invention is a spectacle lens designing method which is characterized in that, in the spectacle lens designing method according to the fourth invention, $a(n, \theta)$ in the above equation (4) is expressed by the following equation (7), letting a be $a(n, 0)$ and $a(n, 90)$ when the azimuth $\theta$ is 0 degree and 90 degrees respectively:

$$a(n, \theta) = a(n, 0) \cdot \cos^2\theta + a(n, 90) \cdot \sin^2\theta + P1(n) \cdot \sin^2(2 \cdot \theta) \quad (7)$$

where a control parameter is one control parameter $P1(n)$ for the degree n of the distance r from the center.

A seventh invention is a spectacle lens which is characterized in that it is designed by the spectacle lens designing method according to any one of the first invention to the sixth invention.

BRIEF DESCRIPTION OF DRAWINGS

FIG. 3 is a view showing Table 1 in which lens data in Example 1 are listed;

FIG. 4 is a view showing Table 2 in which lens data in Comparison example of Example 1 are listed;

FIG. 7 is a view showing Table 3 in which lens data in Example 2 are listed;

FIG. 8 is a view showing the distribution of a first quadrant of the extended DIST in Example 2;

FIG. 9 is a view showing the distribution of the extended DIST in Comparison example of Example 1;

VS . . . rear vertex spherical surface; V . . . rear vertex; W . . . reference point of focal length; R . . . center of rotation of eyeball; FPS . . . far point sphere; Ft . . . focus in radial tangent direction; Fs . . . focus in sagittal direction; D . . . image on far point sphere; Ws . . . reference point of focal length of ray passing on S axis; Wc . . . reference point of focal length of ray passing on C axis; FPS: far point sphere in S axis direction; FPC: far point sphere in C axis direction; Fst: focus in S axis direction of ray passing on S axis; Fss . . . focus in C axis direction of ray passing on S axis; Fct . . . focus in S axis direction of ray passing on C axis; Fcs . . . focus in C axis direction of ray passing on C axis; DS . . . image on far point sphere in S axis direction; DC . . . image on far point sphere in C axis direction; P . . . visual angle magnification evaluation point; MO . . . reference visual angle magnification in P direction; M . . . visual angle magnification at position P

BEST MODE FOR CARRYING OUT THE INVENTION

As a paper on retina and brain processing regarding visual acuity, Optmetric Monthly, November: 31–32 1981: written by Robert N. Kleinstein (hereinafter, referred to as Paper 1) is available.

A drawing in the above Paper 1 shows a view in which a visual acuity measured value is expressed by a fraction visual acuity value, taking S diopter and C diopter as spectacle terms in a horizontal axis and a vertical axis respectively and an experiment of measuring visual acuity of a spectacle wearer with his/her spectacles taken off is conducted. In order to use this Paper 1 as an evaluation function of a merit function in spectacle lens designing, the measured values are modified in such a manner that the signs of the horizontal axis value S and the vertical axis value C are reversed, namely, the residual S diopter and the residual C diopter are taken in the horizontal axis and the vertical axis respectively to obtain evaluation data showing how the visual acuity decreases when a subject person having normal visual acuity wears spectacles with an aberration, reversely to the above experiment.

Figure 12:
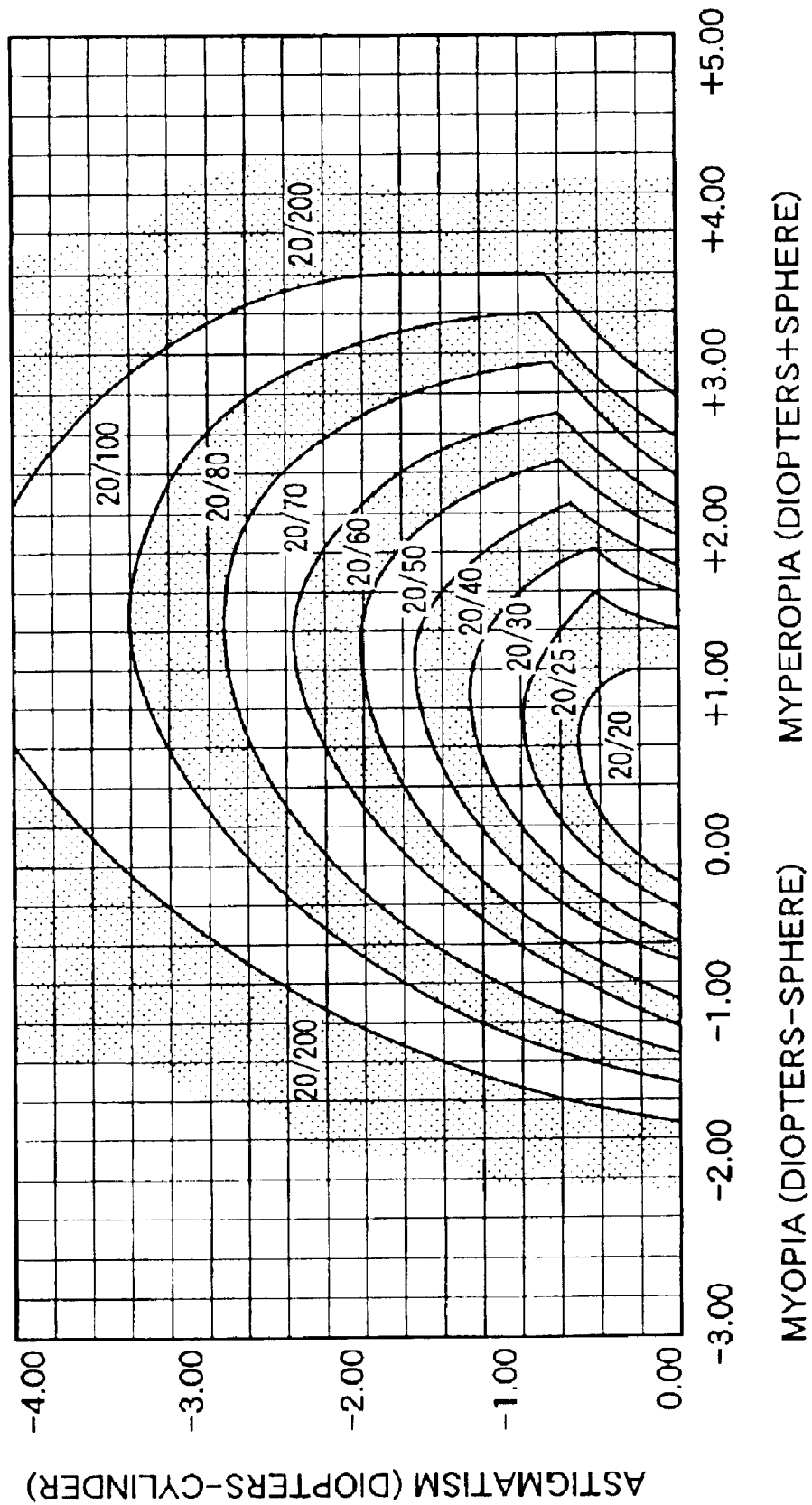
FIG. 12 is a view showing actual measurement values of visual acuity.

In FIG. 12 described above, data for the age of 5 to 15, 25 to 35, and 45 to 55 are provided as actual measurement data, but since it is preferable to use a virtual visual acuity measured value not affected by an adjusting power, the data for the age of 45 to 55 were used from Paper 1 for convenience sake.

The residual S diopter and the residual C diopter mentioned above are correlated to an astigmatism and a curvature of field derived from optical calculation as described later. In the spectacle lens designing in the prior art in which the Listing's Law is not taken into consideration, however, the astigmatism and the curvature of field cannot be calculated accurately in regions in which an eyeball does not rotate along two spectacle principal meridians as previously described. Therefore, a spectacle lens designing system in which the Listing's Law is taken into consideration and which includes new lens aberration (astigmatism and curvature of field) calculation is required in order to use the measured values of the visual acuity measurement in Paper 1 mentioned above as an evaluation function on the entire surface of a lens.

(Spectacle Lens Designing System Including Lens Aberration (Astigmatism and Curvature of Field) Calculation)

Figure 1:
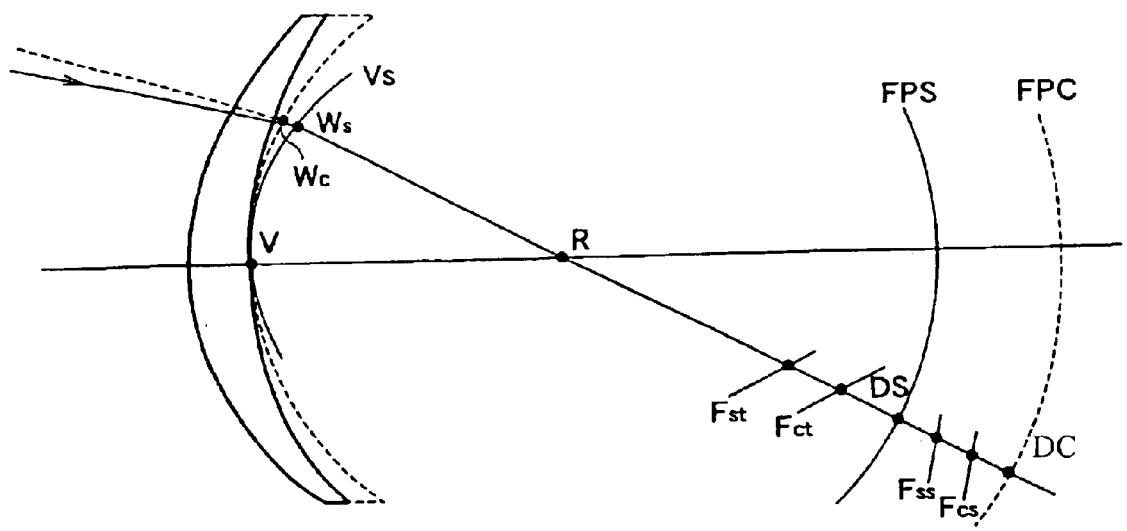
FIG. 1 is an explanatory view of a spectacle lens designing method according to an embodiment of the present invention.
Figure 11:
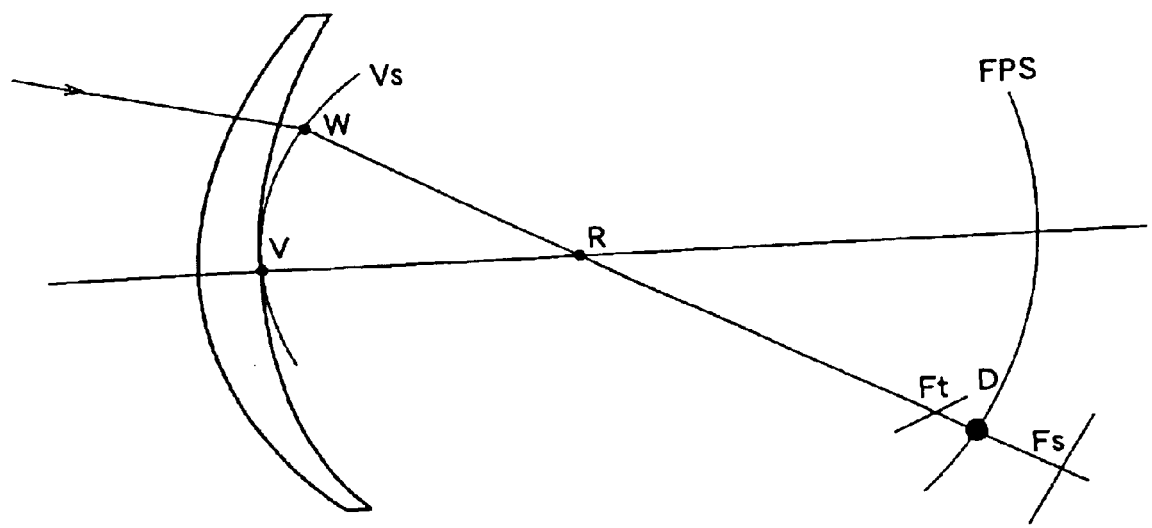
FIG. 11 is an explanatory view of a spectacle lens designing method in a prior art.

FIG. 1 is a view explaining one model to be a factor in a spectacle lens designing method according to an embodiment of the present invention, and FIG. 11 is a view explaining a model in a prior art with which the above model is compared.

In a case of rays passing S and C axes of an astigmatic lens shown in FIG. 1, calculation similar to the case shown in FIG. 11 of a designing system in the prior art is valid.

However, on an axis in a lens radiation direction other than the S and C axes of the astigmatic lens in FIG. 1, it is necessary to calculate the astigmatism and the curvature of field with an eyeball motion taken into consideration, which are calculated by the following method.

Hereinafter, the correlation of the residual S diopter and the residual C diopter with the astigmatism and the curvature of field in the spectacle lens designing system in which the Listing's Law is taken into consideration will be simply explained.

I. (Astigmatism and Curvature of Field)

In Prior art 1 in which the Listing's Law is taken into consideration, when the rotation is in a different direction from the spectacle principal meridians, the angle between the spectacle principal meridians and coordinate axes rotating according to the Listing's Law does not become 0. When the angle deviation as described in the above Prior art 1 occurs, the astigmatism, even when, typically, it is an astigmatism having an absolute value of the astigmatism equal to an absolute value of a reference astigmatism (an astigmatic amount and a cylinder axis at the center of a lens), has a direction like a vector value so that a residual astigmatism whose value is not 0 newly occurs.

As for a calculation method of the above residual astigmatism, methods of calculating an astigmatic lens and of the residual astigmatism of the astigmatic lens as disclosed in, for example, Prior art 1 are applicable.

Meanwhile, the curvature of field as another factor does not change due to the coordinate change according to the Listing's Law since the curvature of field is a scalar amount not related to a vector.

I-1. (Residual Astigmatism)

Therefore, the correlation of the aforesaid residual astigmatism and curvature of field with the residual S diopter and the residual C diopter is as follows:

(1) When the residual astigmatism is positive, their correlation is expressed by the following equations (a), (b):

$$\text{residual } S \text{ diopter} = \text{curvature of field} - \text{residual astigmatism}/2 \quad (a)$$

$$\text{residual } C \text{ diopter} = \text{residual astigmatism} \quad (b)$$

(2) When the residual astigmatism becomes negative in optical calculation, their correlation is expressed by the following equations (c), (d) based on an idea similar to diopter conversion of spectacles since the residual C diopter is defined as positive:

$$\text{residual } S \text{ diopter} = \text{curvature of field} + \text{residual astigmatism}/2 \quad (c)$$

$$\text{residual } C \text{ diopter} = -\text{residual astigmatism} \quad (d)$$

II. (Deriving Merit Function in Which Nonlinear Nature of Living Human Body in View of Optical Performance is Taken into Consideration)

On analyzing FIG. 12 in the aforesaid Paper 1, it is first found out that the horizontal axis (residual S diopter) is not symmetrical with respect to the origin. Furthermore, the vertical axis (residual C diopter) has also nonlinear data peculiar to the living human body.

For example, when visual acuity values with the same absolute value on the horizontal axis and with different signs are examined, it is clear that the functional relation is not simple. Therefore, when optimization calculation is directly done in the optical calculation without taking the nonlinear nature peculiar to the living human body into consideration, this does not always indicate that visual acuity through a designed lens is improved since the visual acuity value is nonlinear relative to an optical performance value.

Therefore, in the embodiment of the present invention, an interpolation function V of fraction visual acuity is first prepared from the data on the fraction visual acuity measured values in FIG. 12. Concretely, an equation (e) by which the interpolation function V can be calculated even with continuous residual S diopter and residual C diopter is prepared using a generally known interpolation method, taking the visual acuity values for horizontal axis values (residual S diopter) and vertical axis values (residual C diopter) by discrete values (every 0.1 to 1 diopter).

This is expressed by the following equation:

$$\text{interpolation function } V = V(\text{residual } S \text{ diopter}, \text{residual } C \text{ diopter}) \quad (e)$$

Using this interpolation function V, the aforesaid residual astigmatism and curvature of field of the lens are calculated, and they are substituted for the residual S diopter and the residual C diopter in the equations (a), (b) or the equations (c), (d).

Then, the optical value and the visual acuity value are correlated in such a manner that a right side is obtained by the optical calculation and a left side is the visual acuity value by actual measurement as in the following equation (f):

$$\text{interpolation function } V = V(\text{curvature of field, residual astigmatism}) \quad (f)$$

The equation (f) in this state can be used as an evaluation function, but since nonlinearity is high, it is not the best state for the optimization calculation.

Therefore, it is further transformed to the following equation (g) expressed by a visual acuity evaluation function logMAR, which is a definition equation for representing visual acuity.

$$\text{the visual acuity evaluation function } (\log MAR) = \log_{10}(1/V(\text{curvature of field, residual astigmatism})) \quad (g)$$

Through the above processes, the evaluation function in which the nonlinear nature of the living human body from the optical performance point of view is taken into consideration is derived.

The visual acuity of the living human body of course changes to a great extent depending on age, a measurement environment, and so on.

In actual application, however, the above-described basic method requires a large calculation amount in the optimization calculation.

Therefore, instead of the equation (e) by which the aforesaid interpolation function V can be calculated, simple approximate equations such as the following equations (h), (i) can be used:

$$V = 2^{-X \cdot K} \quad (h)$$

where, $\cdot K$ is expressed by the following equation (i):

$$K=\{(\text{residual } S \text{ diopter}+\text{residual } C \text{ diopter}/2)^2+(\text{residual } C \text{ diopter}/2)^{1/2}\} \quad (i)$$

·X is a coefficient between 0.5 and 2 according to actually measured data.

In the above case, V may be used as the evaluation function as it is, but the correlation with the visual acuity evaluation function logMAR is expressed by the following equation, as explained in the aforesaid basic method.

the visual acuity evaluation function $(\log MAR)=X\times\log_{10}2\times\{(\text{curvature of field}^2+(\text{residual astigmatism}/2)^2)^{1/2}$ (j)

Furthermore, the approximate equations can be transformed by including measured values according to age besides data in the material for actually measured visual acuity and by using other visual acuity measurement data. For example, the transformation of the equation (h) such as the following equation $V=3^{-K}$ is possible under the condition of within a variable range of X. In this case, the equation (j) becomes as follows:

the visual acuity evaluation function $(\log MAR)=\log_{10}3\times\{(\text{curvature of field}^2+(\text{residual astigmatism}/2)^2)^{1/2}$ III. (Distortion Aberration with the Listing's Law Taken into Consideration)

Furthermore, as an aberration to be corrected for spectacles, which is not related to a visual acuity value, there is a distortion aberration.

This is widely known as a cause of sway and distortion occurring mainly at the beginning when one starts to wear spectacles. Conventionally, the distortion of spectacles is expressed as a visual angle magnification (for example, refer to *KOHGAKU* (OPTICS), Vol. 19, No. 10 "*Futatabi Kakubairitsu nitsuite* (On Angle Magnification Again)" written by Kazuo Miyake, and so on).

When this is expressed by an equation, letting a central visual angle magnification be $M_0$, the following equation (k) is obtained:

central visual angle magnification $M_0=\lim_{exit\ angle\to 0}(\tan(\text{exit angle})/\tan(\text{incident angle}))$ (k)

Here, the central visual angle magnification $M_0$ can be easily calculated by paraxial optical calculation. The central visual angle magnification $M_0$ will be simply explained. When an emergent ray passes the center of eyeball entrance pupil, the central visual angle magnification $M_0$ is called a spectacle magnification.

Further, letting a peripheral visual angle magnification be M, this visual angle magnification M is expressed by the following equation (l):

peripheral visual angle magnification $M=\tan(\text{exit angle})/\tan(\text{incident angle})$ (l)

Then, the distortion aberration (DIST) of the spectacles is expressed by the following equation (m) based on the equations (k), (l):

distortion aberration $DIST=100\times((M/M_0)-1)$ (m)

Incidentally, in the model in FIG. 1, the emergent ray passes the center of rotation of the eyeball and the distortion aberration DIST is called a dynamic distortion aberration of the spectacles.

Here, on studying the equation (m), a residual distortion aberration DIST occurs due to the difference (angle deviation) of an axis direction since the distortion aberration DIST, even when it is the aberration DIST with the same amount, is a vector value, similarly to the previous explanation on the astigmatism.

Therefore, the central visual angle magnification $M_0$ and the peripheral visual angle magnification M in the prior art are calculated as the distortion aberration DIST when they are in the same direction.

For example, if the central visual angle magnification $M_0$ and the peripheral visual angle magnification M in the same direction are the same amount, the distortion aberration DIST is calculated as the distortion aberration DIST=0 by the equation (m).

Since the aforesaid angle deviation caused by the eyeball motion is included in the calculation, the central visual angle magnification $M_0$ and the peripheral visual angle magnification M are both extendedly defined as vector amounts.

Then, when the lens is an astigmatic lens, the rotational visual angle magnification $M_0$ becomes a vector value having a different value in the radiation direction at a lens diopter reference point (usually, the center part of the lens).

When a residual visual angle magnification is defined as a value obtained by subtracting the central visual angle magnification from the peripheral visual angle magnification M, this residual visual angle magnification is expressed by the following equation:

residual visual angle magnification=peripheral visual angle magnification $M$–central visual angle magnification $M_0$ The extended definition of the distortion aberration of the spectacles according to the embodiment of the present invention in which the Listing's Law is taken into consideration becomes the following equations (n), (o):

residual visual angle magnification=peripheral visual angle magnification $M$–central visual angle magnification $M_0$ (n)

residual distortion aberration $DIST$=Sign×100×(absolute value of residual visual angle magnification/absolute value of central visual angle magnification $M_0$) (o)

where Sign is defined as a positive/negative sign of a scalar product of the residual visual angle magnification and the central visual angle magnification $M_0$.

Figure 2:
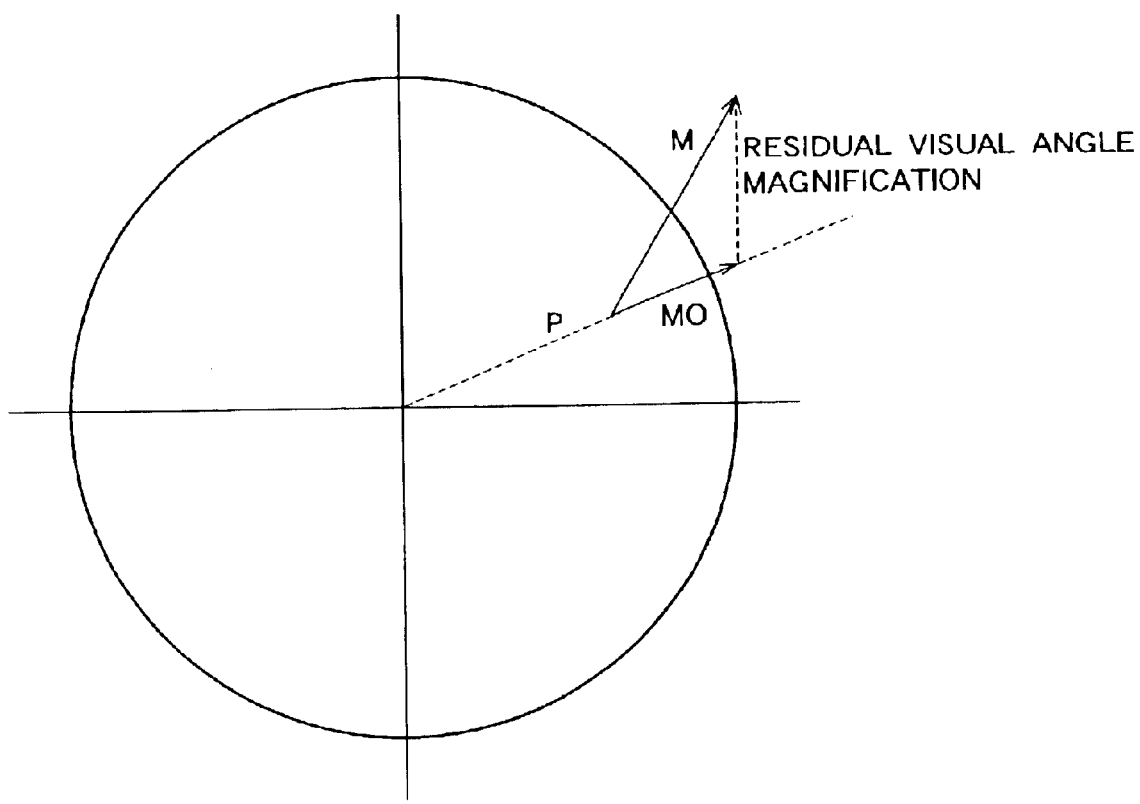
FIG. 2 is an explanatory view of an extended DIST.

FIG. 2 is a view showing the correlation of the equations (n) and (o).

Through the above, a residual distortion aberration equation of the spectacles in which the Listing's Law is taken into consideration is derived and it is further incorporated in the merit function.

IV. (Preparation of Merit Function)

In the spectacle lens designing method according to the embodiment of the present invention, the state in which a ray passes a lens is assumed and simulation calculation is done by the ray tracing method, and usually, about 5 to about 10 axially symmetrical lenses can be adopted and about 15 to about 10000 lenses according to this embodiment can be adopted to calculate the aforesaid equations (g), (o).

In the case of the aforesaid equation (g), different values are obtained depending on the evaluated object distance. Determination on which object distance is to be taken is made in consideration of a lens characteristic and so on.

For example, strictly speaking, there is no actually measured visual acuity value of near vision in an equation (p) described later, but responses to the residual S diopter and the residual C diopter can be calculated assuming that they are similar to those in a case of far vision.

Furthermore, it is said that the dynamic distortion aberration of the spectacles is not related to the object distance theoretically, but actually, no clear material exists on how to deal with the distribution of the visual acuity and the distortion, and so on. Therefore, they can be freely set within a range not departing from the object of the designing.

From the above, the merit function according to the present invention, which is a combined function of evaluation functions and is a single evaluation criterion, becomes the following equation (p).

$$\text{merit function} = a \times \sum_n (u_n \cdot \text{far vision log}MAR_n)^2 + \\ b \times \sum_n (v_n \cdot \text{near vision log}MAR_n)^2 + c \times \sum_n (w_n \cdot \text{residual } DIST_n) \quad (p)$$

Here, a, b, c are weight distribution of respective evaluation functions; u, v, w are weight distribution at respective evaluation points; and n is a lens evaluation point. Of course, the idea (=not adopted) that the weight distribution is 0 (zero) is included, but naturally, they never become 0 synchronously.

However, few objective experimental data which determines the weight is available, and in actual application, the weight distribution is carried out in consideration of the object of using the lens, and aesthetic, economical, optical factors and so on.

Moreover, it is possible to add to the merit function of the present invention items not directly related to the visual acuity such as a lens form and so on.

The aforesaid merit function (p) is made optimized using the optimization method. This optimization method is as explained in the section of the background art previously described (for example, the aforesaid Japanese Patent Publication No. Hei 2-38930 and so on).

The aforesaid merit function (p) will be studied from the viewpoint of the degree of freedom of designing a lens refractive surface.

When a front surface and a rear surface of the lens are free curved surfaces which can be transformed freely under the restrictive condition that the diopter of the lens is fixed based on a prescription value, a first term or a second term in the merit function can be made zero by the transformation of these two surfaces.

Specifically, at a certain object distance, the astigmatism and the curvature of field which are constituent factors of the visual acuity evaluation function logMAR can both be made 0.

However, when an aesthetic factor of its appearance is added and an economical viewpoint such as manufacturing cost is taken into consideration in designing the front surface which is a surface on an object side of the lens, for example, when the restrictive condition of an axially symmetrical aspherical surface is added, it is difficult to synchronously make the residual astigmatism and the curvature of field 0 on the entire surface of the spectacle lens at a certain object distance.

Still more, it is generally difficult to make the residual distortion aberration DIST 0 in the surface structure where lens diopter exists, without influencing other evaluation functions. Therefore, a coefficient and weighting are dealt as design items. Furthermore, from the viewpoint of the degree of freedom of designing, when the structure of the front surface is fixed, for example, by the condition of a sphere and so on, the degree of freedom of designing is restricted, and it becomes difficult to control a third term in the merit function, namely, the residual distortion aberration DIST.

In other words, the merit function is a function in which the aberrations are complicatedly combined as describe above, and if the surface has a restriction such as a sphere when the merit function is optimized by the optimization, the optimization is influenced by the restriction.

Therefore, it is preferable that the front surface and the rear surface of the spectacle lens are both set in such a manner that they can be designed by free transformation, thereby enabling the merit function to be freely controlled and increasing the degree of freedom of designing.

V. (Design of Bi-aspherical Lens)

Here, as a design example in which the degree of freedom of designing is taken into consideration, the explanation will be given on a spectacle lens consisting of aspherical surfaces on both sides, which enables the above merit function to be optimized by the optimization calculation with high precision and with high calculation efficiency.

Since according to the Listing's Law, the rotation is made in a radiation direction from the first eye position of the eye as is previously described, a corresponding expression of a lens surface becomes directly corresponding to the eyeball motion when it is expressed by a spherical coordinate system and a cylindrical coordinate system with the lens center being the origin.

However, when it is expressed by other coordinate systems, for example, an orthogonal coordinate system and so on, a high degree coefficient becomes necessary, though they are mathematically equivalent, in order to bring about an equivalent effect in numerical calculation, and consequently, a calculation error is increased.

Furthermore, though the aforesaid spline curved surface, a NURBS curved surface, and so on are also capable of expressing very free curved surfaces, they are basically the orthogonal coordinate system similarly to the above so that the similar problem occurs in the numerical calculation.

Therefore, in this embodiment, an aspherical surface equation of the cylindrical coordinate system is used as a preferable method (refer to, for example, Prior art 2 for the aspherical surface equation of the cylindrical coordinate system in detail).

(Aspherical Surface Equation Expressing Refractive Surface Shape of Front Surface)

A lens height Z1 of the front surface, which is expressed by the following equation (q), is expressed as an equation of a lens cross section.

$$Z1 = c \cdot r^2 \left/ \left( 1 + \sqrt{1 - (1+k) \cdot c^2 \cdot r^2} \right) + \sum_n a(n) \cdot r^n \right. \quad (q)$$

In the first term of the right side, which is a rotational quadric surface; c is a center curvature; k is a conic coefficient; and r is a distance between the position of the lens projected on a horizontal plane of the cylindrical coordinate system and the origin, and in the second term, which is a deviation from the rotational quadric surface, n, though it takes values from 2, usually takes values from 4 to 12 since it interferes with the first term. a(n) is an n degree coefficient of r and is an amount called an aspherical coefficient.

V-1 (Aspherical Surface Equation Expressing Refractive Surface Shape of Rear Surface)

An equation of the rear surface of the present invention is the following equation (r):

$$Z2 = c(\theta) \cdot r^2 \left/ \left( 1 + \sqrt{1 - (1+k(\theta)) \cdot c(\theta)^2 \cdot r^2} \right) + \sum_n a(n, \theta) \cdot r^n \right. \quad (r)$$

Here, $c(\theta)$, $k(\theta)$ are functions for an azimuth $\theta$. $a(n, \theta)$ is a function for the n degree of the distance r and the azimuth θ. Due to plane symmetry of the astigmatic lens, as for a definition domain of the azimuth θ, 0 degree to 90 degrees can represent 0 degree to 360 degrees. Here, c(θ) is a curvature of the lens center, and letting the curvature of the two principal meridians orthogonal to each other be c(0) and c(90) at 0 degree and 90 degrees respectively, as is stated in the Gaussian curve theorem, the following equation (s) is obtained from the Euler's theorem.

In the case of the lens, 0 degree and 90 degrees are taken in the spherical diopter axis and in the astigmatic diopter axis respectively, and c(θ) is expressed by the following equation (s):

$$c(\theta)=c(0)\cdot\cos^2\theta+c(90)\cdot\sin^2\theta \qquad (s)$$

k(θ) is similar to the above equation (s) and becomes an equation in which the sign c in c(θ) is replaced by the sign k.

a(n, θ) satisfies requirements of plane continuity and plane symmetry, is a surface further satisfying a requirement of a surface which is capable of controlling an aberration due to an angle deviation which occurs due to the Listing's Law, and satisfies the following conditions ① to ④:

①: having a functional relation of the azimuth θ from 0 degree to 90 degrees;

②: a linear differential coefficient of the azimuth θ is 0 from 0 degree to 90 degrees;

③: a high degree differential coefficient is continuous; and

④: having a parameter group: Ps(n) which is capable of controlling a value a(n, θ) at an angle θ of a function between the azimuths 0 degree and 90 degrees (where 1 to 3 are preferable for the number of s from the viewpoint of calculation speed and calculation efficiency, and n signifies a degree in the above equation (r)).

Concretely, for example,
(in a case when the functional relation is a polynominal of an angle)

letting the polynominal be a quartic polynominal of the azimuth θ, and a at 0 degree, 45 degrees, 90 degrees be a(n, 0), a(n, 45), a(n, 90) respectively, a(n, θ) becomes the following equation (t):

$$a(n, \theta)=a(n, 0)+(-11$$
$$\cdot a(n, 0)+16\cdot a(n, 45)-5$$
$$\cdot a(n, 90))$$
$$\cdot \theta^2/(4\cdot 90^2)+(9\cdot a(n, 0)-16$$
$$\cdot a(n, 45)+7\cdot a(n, 90))$$
$$\cdot \theta^3/(4\cdot 90^3)+(-2$$
$$\cdot a(n, 0)+4$$
$$\cdot a(n, 45)-2$$
$$\cdot a(n, 90))$$
$$\cdot \theta^4/(4\cdot 90^4) \qquad (t)$$

In this case, the above-mentioned control parameter in ④ is one for the degree n of the distance r from the center and the control parameter P1(n) is a(n, 45).
(in a case when the functional relation is not a polynominal of an angle, for example, is a trigonometric function)

a(n, θ) is expressed by the following equation (u), letting a be a(n, 0) and a(n, 90) when the azimuth θ is 0 degree and 90 degrees respectively in the following function and letting the control parameter which is one for the degree n of the distance r from the center be P1(n) similarly to the above:

$$a(n, \theta)=a(n, 0)\cdot\cos^2\theta+a(n, 90)\cdot\sin^2\theta+P(1, n)\cdot\sin^2(2\cdot\theta) \qquad (u)$$

The equations (t), (u) both satisfy the above conditions ① to ④.

Thus, there exist various equations satisfying the above conditions ① to ④.

EXAMPLE 1

In Example 1, a spectacle lens is designed using the evaluation function on visual acuity of the present invention, and the outline of the designing procedure thereof will be explained below.

(Step 1): To Set a Basic Design Lens Form of Front and Rear Refractive Surfaces

In this example, a bi-aspherical lens form which has the highest degree of freedom of designing is selected, with the front surface being an aspherical surface which is axially symmetrical and expressed by the above equation (q) and with the rear surface being an aspherical surface expressed by the above equation (r).

(Step 2): To Set Fixed Conditions and Variable Conditions of a Shape Determining Factor Parameter The design conditions are, in the prescription values, a spherical diopter is −7.00 D, a cylindrical diopter is −2.00 D, a refractive index (ne) is 1.7, a lens diameter is 75 mm, and a lens center thickness is 1 mm, as shown in FIG. 7.

In the above aspherical surface equations (q) and (r), k(θ) is 0 and the equation (t) is applied to a(n, θ).

Note that coefficients in the equations are as shown in FIG. 7.

(Step 3): To Set the Merit Function and a Target Value of the Optimization Calculation The above equation (p) is used for the merit function and its condition is a=1, b=0, c=0, and u=1.

The equation (j) is used for the equation of the visual acuity evaluation function logMAR and its condition is X=2.

(Step 4): Optimization Calculation

Based on set lens evaluation points, their evaluation is made using the aforesaid merit function by the ray tracing method, optical performance is evaluated, simulation calculation is repeated by operating transformation parameters constituting the lens refractive surface until the predetermined target value is obtained, and the optimization calculation is carried out.

At this time, an optimal solution is calculated under the condition that the curvature of the front surface does not become negative (incidentally, a lens whose curvature of the front surface becomes negative is described in Prior art 1, but it cannot be said to be aesthetically optimal since a reflected light is strong).

In this example, the final refractive surface shape is determined by fixing the design condition that the front surface is aspherical and by varying the shape of the rear surface so as to satisfy the prescription values. Obtained lens data (final lens performance data after the optimization is finished) are shown in Table 1 in FIG. 3.

Figure 5:
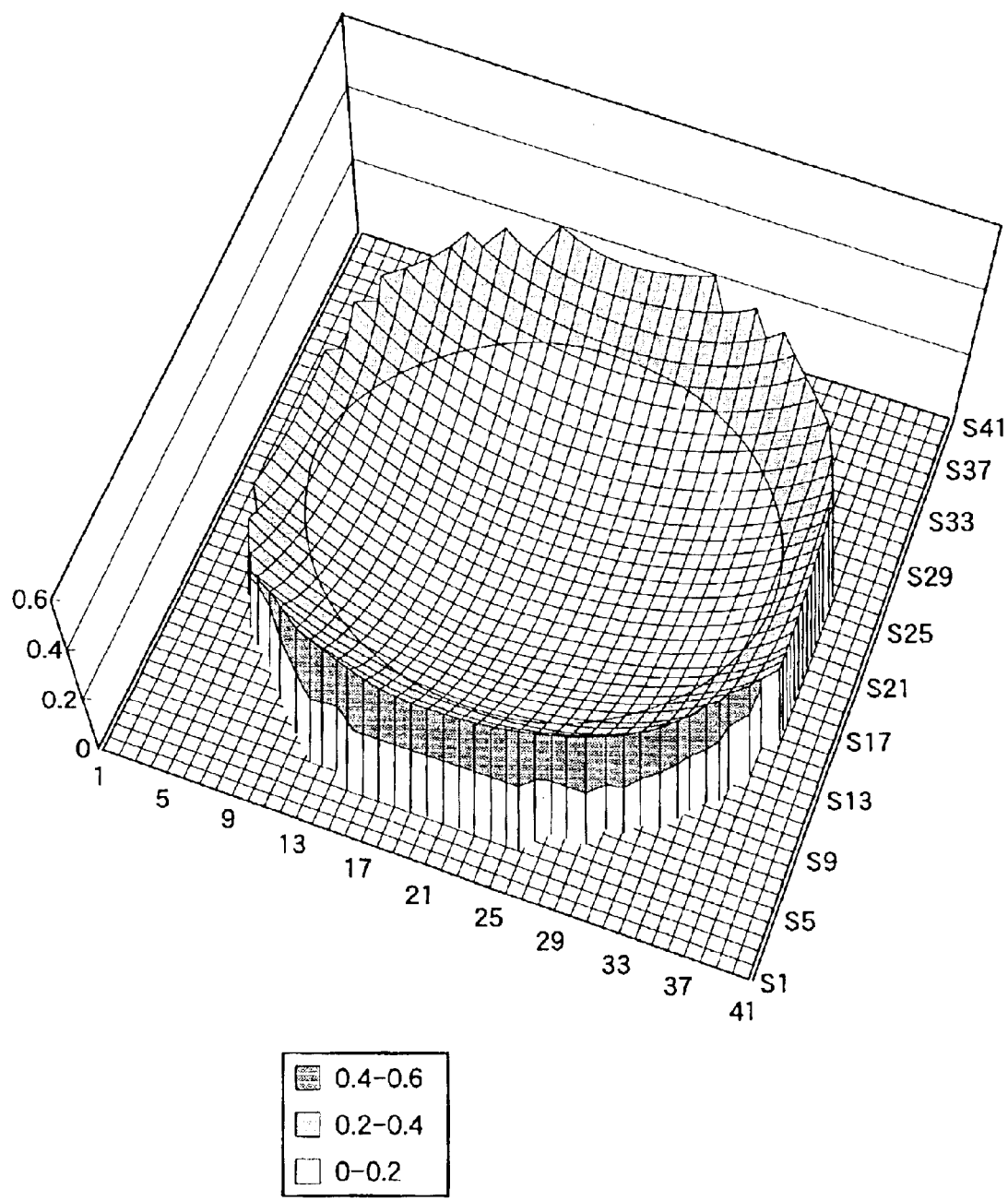
FIG. 5 is a view showing the visual acuity evaluation function (logMAR) in Example 1.

Further, the distribution of the logMAR visual acuity values in Example 1 in the case of the lens data in FIG. 3 is shown in FIG. 5.

64% of a thin portion in the lens center part produces preferable visual acuity whose logMAR visual acuity value is 0.2 or lower.

A Percival Form lens in which the curvature of field is reduced under the same condition as that of Example 1 is shown for comparison.

Figure 6:
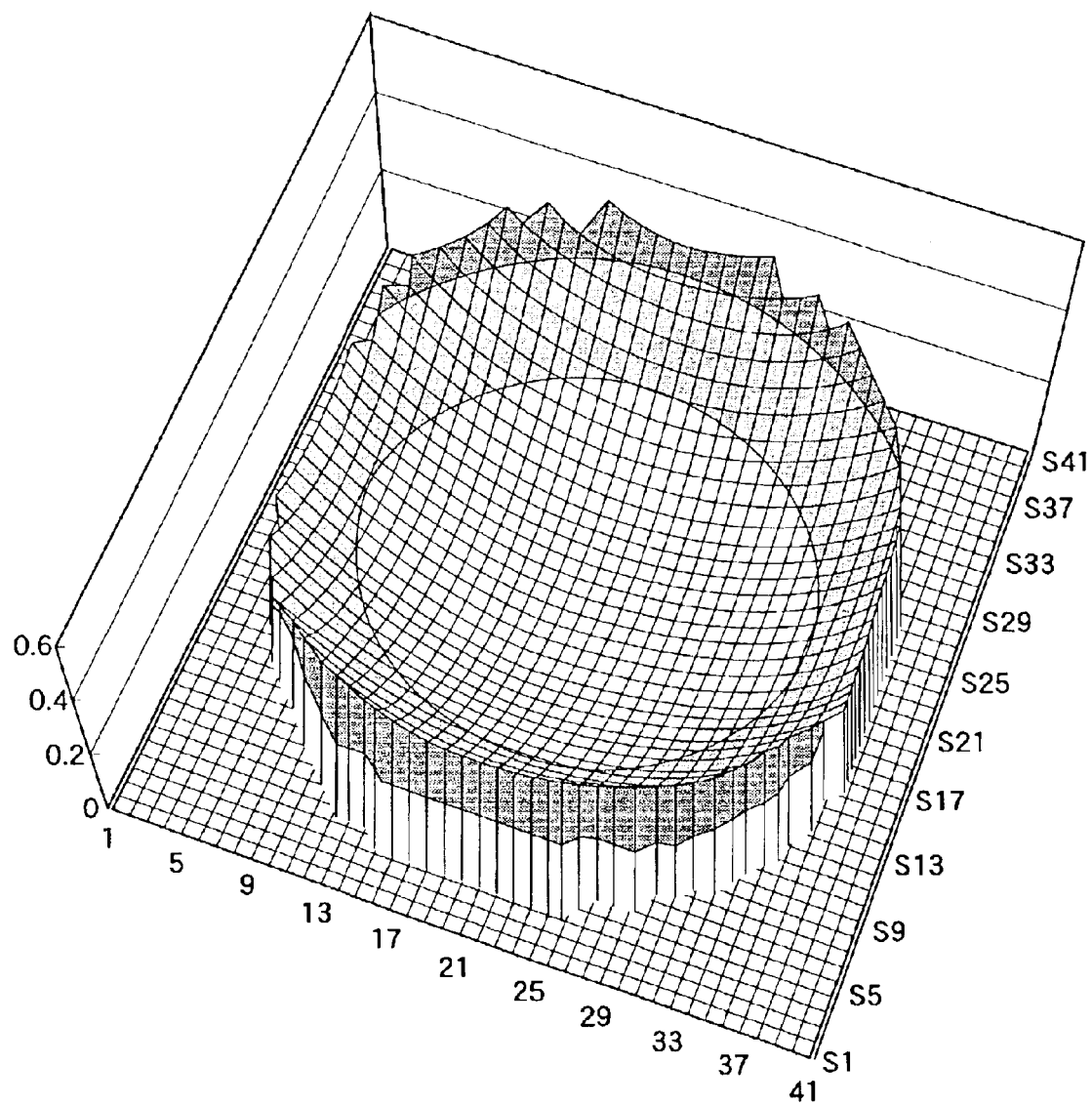
FIG. 6 is a view showing the visual acuity evaluation function (logMAR) in Comparison example of Example 1.

Obtained lens data and the distribution of the logMAR visual acuity values are shown in Table 2 in FIG. 4 and FIG. 6 respectively.

The curvature of field of this lens is preferable, but 56% of the thin portion of the lens center part produces the preferable visual acuity whose logMAR visual acuity value is 0.2 or lower.

Thus, it is clear that the preferable visual acuity range is obtained in FIG. 5, compared with that in FIG. 6, and the control of the evaluation function of visual acuity can sufficiently be performed so that the expected effect is obtained.

EXAMPLE 2

In Example 2, an evaluation function on the residual distortion aberration DIST is further added to Example 1 to design a spectacle lens. Since the lens does not produce visual acuity and the optimal solution cannot be obtained when only the residual distortion aberration DIST is used in the aforesaid merit function equation (p), the logMAR visual acuity value and the residual distortion aberration DIST are balanced in the equation (p).

In the equation (p), a=1, b=0, c=0.02, u=1, and w=1, and the equation (j) is used for the equation for the visual acuity evaluation function logMAR.

The equations (q), (r) are used for the bi-aspherical surface equation, $k(\theta)$ is 0, and the equation (t) is applied for $a(n, \theta)$.

The data in FIG. 5 in Example 1 are used for the front surface. Though this is not a suitable condition for greatly improving the residual distortion aberration DIST since a fixed condition is set for the front and rear surfaces, the optimization calculation is done under the above condition since it is indicated that the residual distortion aberration DIST can be controlled within a certain range. Obtained lens data are shown in Table 3 in FIG. 7.

FIG. 8 is a table showing the distribution of the residual distortion aberration DIST in the first quadrant. The lowest right end is the lens center, where the residual distortion aberration DIST is 0. The horizontal axis is a lens exit angle in the lens S axis direction, which is shown for every 3 degree pitch, and similarly, the vertical axis is the same in the lens C axis direction.

FIG. 9 shows, as a comparison example, the distribution of the residual distortion aberration DIST under the condition in FIG. 5 in Example 1 in which the residual distortion aberration DIST is not evaluated as an evaluation function. The final values of the horizontal axis and the vertical axis in FIG. 8 are 43% and 60%, and the final values of the horizontal axis and the vertical axis in FIG. 9 are 44% and 63%. Since a smaller value signifies more preferable state in this case, it is clear that the control of the evaluation function for the residual distortion aberration DIST can be sufficiently performed and the expected effect is obtained.

Figure 10:
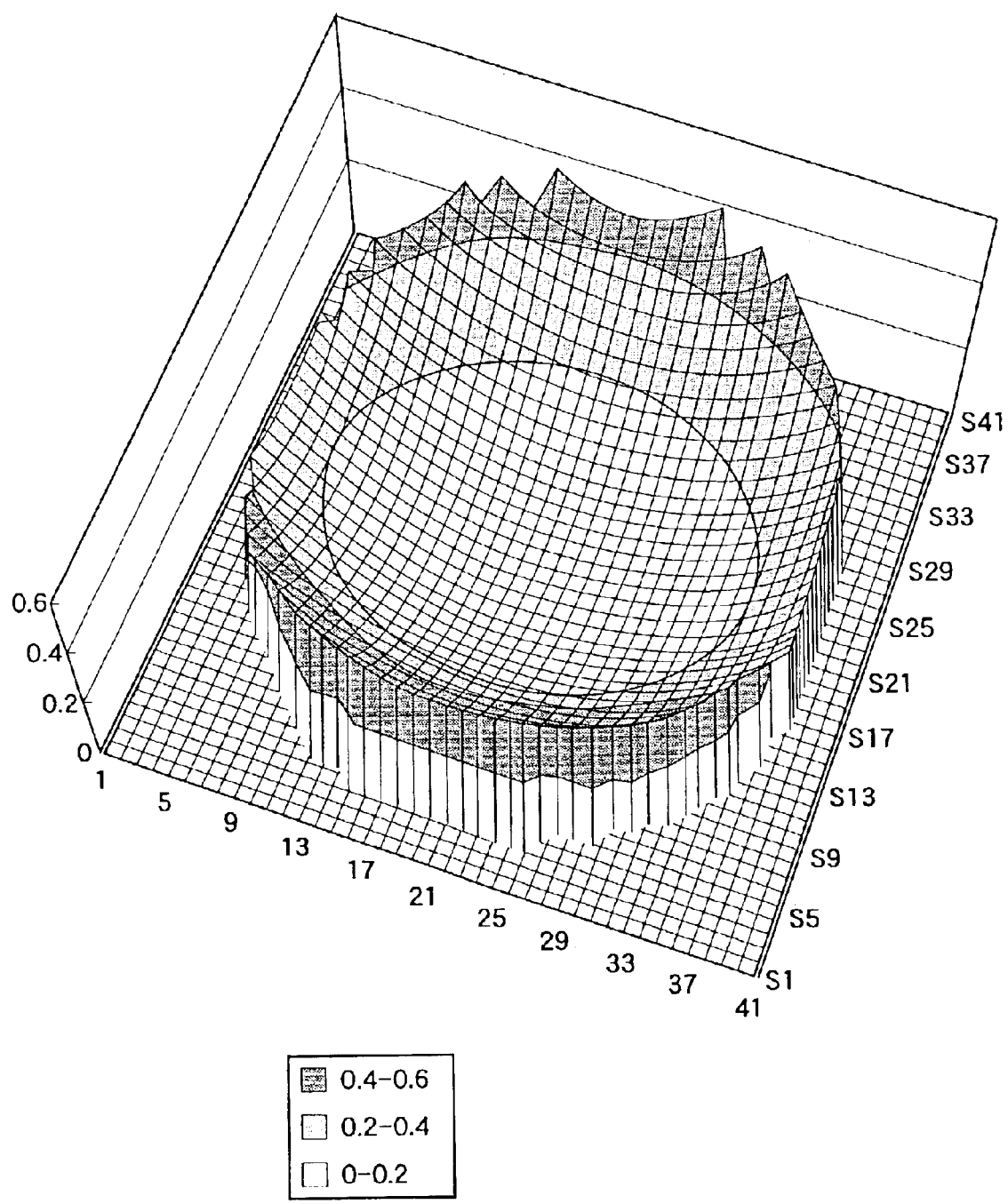
FIG. 10 is a view showing the visual acuity evaluation function (logMAR) in Example 2.

Incidentally, a distribution view of the logMAR visual acuity under the condition in FIG. 7 is shown in FIG. 10. The range where the logMAR visual acuity value is 0.2 or lower is 53%, and in improving the residual distortion aberration DIST and the logMAR visual acuity value, they are in a trade-off correlation in which, when one value is improved, the other value is lowered.

However, since sway is usually sensed at a peripheral portion, it is also possible to improve the residual distortion aberration DIST in such a manner that the distribution of the weights (u, v, w) at the respective evaluation points in the aforesaid merit function equation (q) is devised so as to give a higher weight to the logMAR visual acuity value in the center portion and to sacrifice the logMAR visual acuity value in the peripheral portion.

The merit function including the visual acuity evaluation function according to the present invention is used for the bi-aspherical type lens having a single focus in this example. However, since the technical structure of the invention is characterized in that the visual acuity evaluation function is used as the evaluation function of the merit function used in the optimization calculation, it is not limited by the refractive shape of the lens surface, and can be used in designing of all lenses including progressive refracting surfaces.

For example, in a progressive-power lens, other factors such as a distance portion, a near portion, a progressive zone are added besides weighting on the lens central portion and peripheral portion, which is used in a case of ordinary lenses, and near vision weighted design, far vision weighted design, intermediate vision weighted design, and so on are also added to the object of the designing. However, since the progressive-power lens uses the aspherical lens surface similarly to this example when classified in terms of a lens surface, the present invention is applicable to the progressive-power lens by making the merit function according to the present invention correspond to the object of its designing, appropriately setting the weight distribution at the evaluation points, setting target diopter and a target distortion aberration, and changing these design items.

The present invention is especially useful for the designing in which the Listing's Law is taken into consideration since an accurate simulation can be carried out.

Furthermore, the same thing can be said for a lens whose rear surface is a fusion surface of an aspherical surface and an astigmatic surface.

In this example, data in Optmetric Monthly, November: 31–32 1981: written by Robert N. Kleinstein are used as a paper on the processing in the retina and the brain regarding visual acuity. The present invention, however, is not limited to this, and any data can be used and the visual acuity evaluation function included in the present invention can be derived from the data, as long as they are data on the visual acuity measured value in which, for example, visual acuity and diopter are correlated.

Furthermore, in a manufacturing method, in the case of, for example, the bi-aspherical lens in this example, the front surface is made to be an axially symmetrical aspherical surface and the rear surface is made to be an aspherical lens of the free curved surface, so that a semi-finished lens can be used, which is effective in terms of time and cost. In other words, when a plurality of axially symmetrical aspherical lens having a predetermined common base curve are prepared in advance as described above, the semi-finished lens is first selected according to the prescription after receipt of order, and thereafter, its rear surface is designed, it is more advantageous than to design a convex surface and a concave surface after each receipt of order and prepare a finished lens.

Moreover, by the aforesaid fixing of the design, it becomes possible to prepare finished products in advance in stock according to the prescription.

Industrial Availability

As detailed above, in contrast to a spectacle lens designing in a prior art in which the performance of a spectacle lens is evaluated only with indexes such as an optical amount on the retina and aberrations based on the technical idea that the performance of the spectacle lens is improved as optical performance is made higher, it becomes possible to design a spectacle lens based on a simulation on a living human body, in which the viewpoints of the processing in the retina and the brain and of an eyeball motion are taken into consideration, and a spectacle lens with higher performance can be obtained.

What is claimed is:

1. A spectacle lens designing method in which motion of an eyeball (Listing's Law) is taken into consideration, the method comprising:

performing an optimization calculation process for designing a spectacle lens using a merit function which includes a visual acuity evaluation function (logMAR) derived from a visual acuity measured value V, where the visual acuity evaluation function (logMAR) is expressed by the following equation (1)

the visual acuity evaluation function (log*MAR*)=$\log_{10}$(1/*V* (curvature of field, residual astigmatism)) (1), wherein a curvature of field is an aberration of the spectacle lens and a residual astigmatism is an astigmatism defined from spectacle lens designing in which Listing's Law is considered.

2. A spectacle lens designing method according to claim 1, wherein said visual acuity measured value V is V=$2^{-x \cdot K}$ (where K={(residual S diopter+residual C diopter/2)$^2$+ (residual C diopter/2)$^2$}$^{1/2}$ and X is a coefficient between 0.5 and 2 according to actual measurement data), and said visual acuity evaluation function (logMAR) is expressed by the following equation (2) which is an approximate equation:

the visual acuity evaluation function (log*MAR*)=$X \times \log_{10} 2 \times$ {curvature of field$^2$+(residual astigmatism/2)$^2$}$^{1/2}$ (2).

3. A spectacle lens designing method according to claim 1, wherein said merit function includes an evaluation function on a distortion aberration (residual distortion aberration DIST) and said evaluation function is expressed by the following equation (3):

residual distortion aberration *DIST*=Sign×100×(absolute value of residual visual angle magnification/absolute value of central visual angle magnification $M_0$) (3)

where:
the residual visual angle magnification is the distortion aberration defined from the spectacle lens designing in which Listing's Law is considered; and
Sign is a positive/negative sign.

4. A spectacle lens designing method according to claim 1, wherein said merit function is used to perform an optimization calculation process for designing a bi-aspherical lens in which a front surface is an axially symmetrical aspherical surface and a rear surface is an aspherical surface expressed by the following equation (4):

$$Z2 = c(\theta) \cdot r^2 \bigg/ \left(1 + \sqrt{1 - (1+k(\theta)) \cdot c(\theta)^2 \cdot r^2}\right) + \sum_n a(n, \theta) \cdot r^n \quad (4)$$

where:
$c(\zeta)$, $k(\theta)$ are functions for an azimuth $\theta$;
$a(n, \theta)$ is a function for an n degree of a distance r and the azimuth $\theta$;

as for a definition domain of the azimuth $\theta$, 0 degrees to 90 degrees represents 0 degrees to 360 degrees due to plane symmetry of an astigmatic lens;

$c(\theta)$ is a curvature of a lens center and is expressed by the following equation (5) based on Euler's theorem, letting a curvature of a spectacle principal meridian in a Gaussian curve theorem be c(0) at 0 degrees and c(90) at 90 degrees, wherein, 0 degrees is a spherical diopter axis and 90 degrees is a cylinder diopter axis;

$$c(\theta)=c(0)° \cos^2\theta + c(90)° \sin^2\theta \quad (5);$$

$c(\theta)$ is a curvature of a lens center and is expressed by the following equation (5) based on Euler's theorem, letting a curvature of a spectacle principal meridian in a Gaussian curve theorem be c(0) at 0 degrees and c(90) at 90 degrees, wherein, 0 degrees is a spherical diopter axis and 90 degrees is a cylinder is a cylinder diopter axis;

$$c(\theta)=c(0)° \cos^2\theta + c(90)° \sin^2\theta \quad (5)$$

$k(\theta)$, which is similar to said $c(\theta)$, represents an equation in which the sign c is replaced by the sign k in said equation (5); and $a(n, \theta)$ satisfies requirements of plane continuity and plane symmetry, is a surface further satisfying a requirement of a surface which is capable of controlling an aberration due to an angle deviation which occurs due to the Listing's Law, and further satisfies the following conditions 1 to 4:

1: having a functional relation of the azimuth $\theta$ from 0 degree to 90 degrees;
2: a linear differential coefficient of the azimuth $\theta$ is 0 from 0 degree to 90 degrees;
3: a high degree differential coefficient is continuous; and
4: having a control parameter group Ps(n) which is capable of controlling a value of $a(n, \theta)$ at an angle $\theta$ of a function between the azimuths of 0 degree and 90 degrees (where 1 to 3 are preferable for the number of s, and n signifies a degree in said equation (4)).

5. A spectacle lens designing method according to claim 4, wherein $a(n, \theta)$ in said equation (4) is expressed by the following equation (6) which is a quartic polynominal of the azimuth $\theta$, letting a be a(n, 0), a(n, 45), and a(n, 90) when azimuth $\theta$ is 0 degree, 45 degrees, and 90 degrees respectively:

$a(n, \theta) = a(n, 0)$ $+(-11°a(n, 0)$ $+16°a(n, 45)$ $-5°a(n, 90))°\theta^2/(4°90^2)$ $+(9°a(n, 0)$ $-16°a(n, 45)$ $+7°a(n, 90))°\theta^3/(4°90^3)$ $+(-2°a(n, 0)$ $+4°a(n, 45)$ $-2°a(n, 90))°$ $\theta^4/(4°90^4)$ (6)

where a control parameter is one for the degree n of the distance r from the center and a control parameter P1(n) is a(n, 45).

6. A spectacle lens designing method according to claim 4, wherein a(n, θ) in said equation (4) is expressed by the following equation (7), where a is a(n, 0) and a(n, 90) when the azimuth θ is 0 degrees and 90 degrees respectively:

$$a(n, \theta) = a(n, 0)° \cos^2\theta + a(n, 90)° \sin^2\theta + P1(n)° \sin^2(2°\theta) \quad (7),$$

where the control parameter is one control parameter P1(n) for the degree n of the distance r from the center.

7. A spectacle lens, being designed by the spectacle lens designing method according to claim 1.

8. A spectacle lens designing method according to claim 2, wherein said merit function is used to perform an optimization calculation process for designing a bi-aspherical lens in which a front surface is an axially symmetrical aspherical surface and a rear surface is an aspherical surface expressed by the following equation (4):

$$Z2 = c(\theta) \cdot r^2 \bigg/ \left(1 + \sqrt{1 - (1 + k(\theta)) \cdot c(\theta)^2 \cdot r^2}\right) + \sum_n a(n, \theta) \cdot r^n \quad (4)$$

where:
  c(θ), k(θ) are functions for an azimuth θ;
  a(n, θ) is a function for an n degree of a distance r and the azimuth θ;
  as for a definition domain of the azimuth θ, 0 degrees to 90 degrees represents 0 degrees to 360 degrees due to plane symmetry of an astigmatic lens;
  c(θ) is a curvature of a lens center and is expressed by the following equation (5) based on Euler's theorem, letting a curvature of a spectacle principal meridian in a Gaussian curve theorem be c(0) at 0 degrees and c(90) at 90 degrees, wherein, 0 degrees is a spherical diopter axis and 90 degrees is a cylinder diopter axis;

$$c(\theta) = c(0)° \cos^2\theta + c(90)° \sin^2\theta \quad (5);$$

k(θ), which is similar to said c(θ), represents an equation in which the sign c is replaced by the sign k in said equation (5); and
  a(n, θ) satisfies requirements of plane continuity and plane symmetry, is a surface further satisfying a requirement of a surface which is capable of controlling an aberration due to an angle deviation which occurs due to the Listing's Law, and further satisfies the following conditions 1 to 4:
  1: having a functional relation of the azimuth θ from 0 degrees to 90 degrees;
  2: a linear differential coefficient of the azimuth θ is 0 from 0 degrees to 90 degrees;
  3: a high degree differential coefficient is continuous; and
  4: having a control parameter group Ps(n) which is capable of controlling a value of a(n, θ) at an angle θ of a function between the azimuths of 0 degrees and 90 degrees (where 1 to 3 are preferable for the number of s, and n signifies a degree in said equation (4)).

9. A spectacle lens designing method according to claim 3, wherein said merit function is used to process an optimization calculation for designing a bi-aspherical lens in which a front surface is an axially symmetrical aspherical surface and a rear surface is an aspherical surface expressed by the following equation (4):

$$Z2 = c(\theta) \cdot r^2 \bigg/ \left(1 + \sqrt{1 - (1 + k(\theta)) \cdot c(\theta)^2 \cdot r^2}\right) + \sum_n a(n, \theta) \cdot r^n \quad (4)$$

where:
  c(θ), k(θ) are functions for an azimuth θ;
  a(n, θ) is a function for an n degree of a distance r and the azimuth θ;
  as for a definition domain of the azimuth θ, 0 degrees to 90 degrees represents 0 degrees to 360 degrees due to plane symmetry of an astigmatic lens;
  k(θ), which is similar to said c(θ), represents an equation in which the sign c is replaced by the sign k in said equation (5); and
  a(n, θ) satisfies requirements of plane continuity and plane symmetry, is a surface further satisfying a requirement of a surface which is capable of controlling an aberration due to an angle deviation which occurs due to the Listing's Law, and further satisfies the following conditions 1 to 4:
  1: having a functional relation of the azimuth θ from 0 degrees to 90 degrees;
  2: a linear differential coefficient of the azimuth θ is 0 from 0 degrees to 90 degrees;
  3: a high degree differential coefficient is continuous; and
  4: having a control parameter group Ps(n) which is capable of controlling a value of a(n, θ) at an angle θ of a function between the azimuths of 0 degrees and 90 degrees (where 1 to 3 are preferable for the number of s, and n signifies a degree in said equation (4)).

10. A spectacle lens, being designed by the spectacle lens designing method according to claim 2.

11. A spectacle lens, being designed by the spectacle lens designing method according to claim 3.

12. A spectacle lens, being designed by the spectacle lens designing method according to claim 4.

13. A spectacle lens, being designed by the spectacle lens designing method according to claim 5.

14. A spectacle lens, being designed by the spectacle lens designing method according to claim 6.

* * * * *

UNITED STATES PATENT AND TRADEMARK OFFICE
CERTIFICATE OF CORRECTION

PATENT NO. : 6,811,260 B2
DATED : November 2, 2004
INVENTOR(S) : Tetsuma Yamakaji It is certified that error appears in the above-identified patent and that said Letters Patent is hereby corrected as shown below:

Title page,
Item [54], Title, please delete the following:
"EYEGLASS LENS DESIGNING METHOD AND EYEGLASS LENS"
and replace with:
-- SPECTACLE LENS DESIGNING METHOD AND SPECTACLE LENS --

Column 17,
Line 60, please replace:

$$\text{``}Z2 = c(\theta) \cdot r^2 / (1 + \sqrt{1 - (1 + k(\theta)) \cdot c(\theta)^2 \cdot r^2}) + \sum_n a(n,\theta) \cdot r^n \quad \ldots(4)\text{''}$$ with:

$$\text{--}Z2 = c(\theta) \cdot r^2 / (1 + \sqrt{1 - (1 + k(\theta)) \cdot c(\theta)^2 \cdot r^2}) + \sum_n a(n,\theta) \cdot r^n \quad \ldots(4)\text{--}$$

Line 65, please replace "$c(\zeta)$" with -- $c(\theta)$ --

Column 18,
Line 11, please replace "$c(\theta) = c(0)^{\underline{o}} \cos^2\theta + c(90)^{\underline{o}} \sin^2\theta \quad \ldots(5);$" with
-- $c(\theta) = c(0) \cdot \cos^2\theta + c(90) \cdot \sin^2\theta \quad \ldots(5);$ --
Line 13, please delete:
"$c(\theta)$ is a curvature of a lens center and is expressed by the following equation (5) based on Euler's theorem, letting a curvature of a spectacle principal meridian in a Gaussian curve theorem be c(0) at 0 degrees and c(90) at 90 degrees, wherein, 0 degrees is a spherical diopter axis and 90 degrees is a cylinder diopter axis;

$c(\theta) = c(0) \cdot \cos^2\theta + c(90) \cdot \sin^2\theta \quad \ldots(5);$"

Lines 51-68, please replace:
"$a(n, \theta) = a(n, 0)$
$+ (-11^{\underline{o}} a(n, 0)$
$+ 16^{\underline{o}} a(n, 45)$
$-5^{\underline{o}} a(n, 90))^{\underline{o}} \theta^2/(4^{\underline{o}} 90^2)$
$+ (9^{\underline{o}} a(n, 0)$
$-16^{\underline{o}} a(n, 45)$
$+ 7^{\underline{o}} a(n, 90))^{\underline{o}} \theta^3/(4^{\underline{o}} 90^3)$
$+ (-2^{\underline{o}} a(n, 0)$
$+ 4^{\underline{o}} a(n, 45)$
$-2^{\underline{o}} a(n, 90))^{\underline{o}}$
$\theta^4/(4^{\underline{o}} 90^4) \quad \ldots(6)$" with

UNITED STATES PATENT AND TRADEMARK OFFICE
CERTIFICATE OF CORRECTION

PATENT NO. : 6,811,260 B2  
DATED : November 2, 2004  
INVENTOR(S) : Tetsuma Yamakaji It is certified that error appears in the above-identified patent and that said Letters Patent is hereby corrected as shown below:

Column 18 (cont'd),
-- $a(n, \theta) = a(n, 0) + (-11 \cdot a(n, 0) + 16 \cdot a(n, 45) - 5 \cdot a(n, 90)) \cdot \theta^2/(4 \cdot 90^2) + (9 \cdot a(n, 0) - 16 \cdot a(n, 45) + 7 \cdot a(n, 90)) \cdot \theta^3/(4 \cdot 90^3) + (-2 \cdot a(n, 0) + 4 \cdot a(n, 45) - 2 \cdot a(n, 90)) \cdot \theta^4/(4 \cdot 90^4)$ …(6) --

Column 19,
Line 9, please replace:
"$a(n, \theta) = a(n, 0)^{\circ} \cos^2 \theta + a(n, 90)^{\circ} \sin^2 \theta + P1(n)^{\circ} \sin^2(2^{\circ} \theta)$     …(7)," with
-- $a(n, \theta) = a(n, 0) \cdot \cos^2 \theta + a(n, 90) \cdot \sin^2 \theta + P1(n) \cdot \sin^2(2 \cdot \theta)$     …(7), --
Line 23, please replace:

"$Z2 = c(\theta) \cdot r^2/(1 + \sqrt{1 - (1 + k(\theta)) \cdot c(\theta)^2 \cdot r^2}) + \sum_{n} a(n, \theta) \cdot r^n$     …(4)" with:

-- $Z2 = c(\theta) \cdot r^2/(1 + \sqrt{1 - (1 + k(\theta)) \cdot c(\theta)^2 \cdot r^2}) + \sum_{n} a(n, \theta) \cdot r^n$     …(4)--

Line 40, please replace:
"$c(\theta) = c(0)^{\circ} \cos^2 \theta + c(90)^{\circ} \sin^2 \theta$     …(5);" with
-- $c(\theta) = c(0) \cdot \cos^2 \theta + c(90) \cdot \sin^2 \theta$     …(5); --

Column 20,
Line 13, please replace:

"$Z2 = c(\theta) \cdot r^2/(1 + \sqrt{1 - (1 + k(\theta)) \cdot c(\theta)^2 \cdot r^2}) + \sum_{n} a(n, \theta) \cdot r^n$     …(4)" With:

-- $Z2 = c(\theta) \cdot r^2/(1 + \sqrt{1 - (1 + k(\theta)) \cdot c(\theta)^2 \cdot r^2}) + \sum_{n} a(n, \theta) \cdot r^n$     …(4)--

UNITED STATES PATENT AND TRADEMARK OFFICE
CERTIFICATE OF CORRECTION

PATENT NO. : 6,811,260 B2
DATED : November 2, 2004
INVENTOR(S) : Tetsuma Yamakaji It is certified that error appears in the above-identified patent and that said Letters Patent is hereby corrected as shown below:

Column 20 (cont'd),
Between lines 23 and 24, please insert:
-- $c(\theta)$ is a curvature of a lens center and is expressed by the following equation (5) based on Euler's theorem, letting a curvature of a spectacle principal meridian in a Gaussian curve theorem be $c(0)$ at 0 degrees and $c(90)$ at 90 degrees, wherein, 0 degrees is a spherical diopter axis and 90 degrees is a cylinder diopter axis;

$$c(\theta) = c(0) \cdot \cos^2\theta + c(90) \cdot \sin^2\theta \qquad \ldots (5)$$
--

Signed and Sealed this

Twenty-second Day of March, 2005

JON W. DUDAS
*Director of the United States Patent and Trademark Office*